United States Patent [19]
Chapman et al.

[11] Patent Number: 5,590,055
[45] Date of Patent: Dec. 31, 1996

[54] METHOD FOR DESCRIBING MEASURED RESULTS

[75] Inventors: William Chapman, Scottsdale; Gwo-Jer Chang, Mesa; Emerald Hwang, Tempe, all of Ariz.; James Holt, Del Valle, Tex.; Lee Howington, Austin, Tex.; James Chalmers, Pflugerville, Tex.

[73] Assignee: Motorola, Inc., Schaumburg, Ill.

[21] Appl. No.: 410,649

[22] Filed: Mar. 24, 1995

Related U.S. Application Data

[63] Continuation of Ser. No. 196,539, Feb. 15, 1994, abandoned.
[51] Int. Cl.⁶ .................................................. G06F 17/30
[52] U.S. Cl. ........................ 364/550; 364/551.01
[58] Field of Search .................. 364/550, 551.01; 395/100, 118, 155

[56] References Cited

U.S. PATENT DOCUMENTS

| | | | |
|---|---|---|---|
| 4,805,089 | 2/1989 | Lane et al. | 364/188 |
| 4,843,538 | 6/1989 | Lane et al. | 364/188 |
| 4,847,795 | 7/1989 | Baker et al. | 364/579 |
| 4,951,190 | 8/1990 | Lane et al. | 364/188 |
| 4,967,381 | 10/1990 | Lane et al. | 364/551.01 |
| 5,208,765 | 5/1993 | Turnbull | 364/552 |
| 5,226,118 | 7/1993 | Baker et al. | 395/161 |
| 5,418,943 | 5/1995 | Borgida et al. | 395/600 |
| 5,434,971 | 7/1995 | Lysakowski, Jr. | 395/200 |

*Primary Examiner*—Emanuel T. Voeltz
*Assistant Examiner*—Patrick J. Assouad
*Attorney, Agent, or Firm*—Rennie Williams Dover; Harry A. Wolin

[57] ABSTRACT

A method for generically describing measured results which includes defining a class of entities to be measured, and a set of criteria which distinguish entities within the class of entities to be measured. A computer display format is dynamically configured based on the set of criteria. The set of criteria is displayed on the computer display according to the computer display format. The values related to an individual entity are interactively specified. The set of measurements related to class of entities to be measured is displayed on the computer display screen and are associated with the set of criteria.

10 Claims, 3 Drawing Sheets

| STRUCTURE TYPE: MOS TRANSISTOR N—43 | | | | | |
|---|---|---|---|---|---|
| TESTS | DEVICES | | | | |
| | N:10x10 | N:11x11 | N:12x12 | N:10x10; GATE W/DIODE | |
| VT:D=0.1V; W=0V | X | 47 | | | |
| VT:D=0.1V; W=3.3V | 47 | | | 47 | |
| V<sub>TSAT</sub>:D=3.3V W=0V,MEAS | | | | | |
| GM:D=0.1V W=0V | X | | 47 | | 46 |
| | | | | | |
| | | | | | |
| | | | | | |
| | | | | | |

FIG. 3

METHOD FOR DESCRIBING MEASURED RESULTS

This application is a continuation of prior application Ser. No. 08/196,539, filed Feb. 15, 1994 now abandoned.

FIELD OF THE INVENTION

The present invention relates, in general, to methods for organizing experimental results, and more particularly to a method for building a generic database of experimental measurements.

BACKGROUND OF THE INVENTION

In commercial settings, engineering databases are available to engineers for analysis using a data analysis component related to the system. Measured values are typically stored in such a database by tagging them with a unique identifier known as a parameter. Each parameter has a name and number associated with it. The parameters describe data and conditions under which it was collected and also associate the data with the particular test equipment used.

The number of unique parameters measured for storage and analysis in a typical commercial laboratory database is in excess of 50,000. The number of stored measurements for these parameters exceeds fifty million. New parameter definitions are created at the rate of hundreds or thousands per week. Methods of defining and enforcing standards for these large numbers of parameters are absolutely essential in order to produce high quality analysis and transfer of meaningful information between engineering groups. The tools available in the prior art for defining and maintaining parameter definitions were insufficient for this challenge.

There is a need for a method for gathering, storing, and analyzing large amounts of engineering data in an organized fashion. This method should be usable at many sites and have flexible configuration options. Ideally, system configuration should consist of loading information into standard database tables. As a result the configuration should define the relationships between the system components as well as the behavior of individual system components.

BRIEF DESCRIPTION OF THE DRAWINGS

FIG. 3 shows a matrix display of a typical structure and test matrix used by the system of FIG. 1.

DETAILED DESCRIPTION OF THE DRAWINGS

Figure 1:
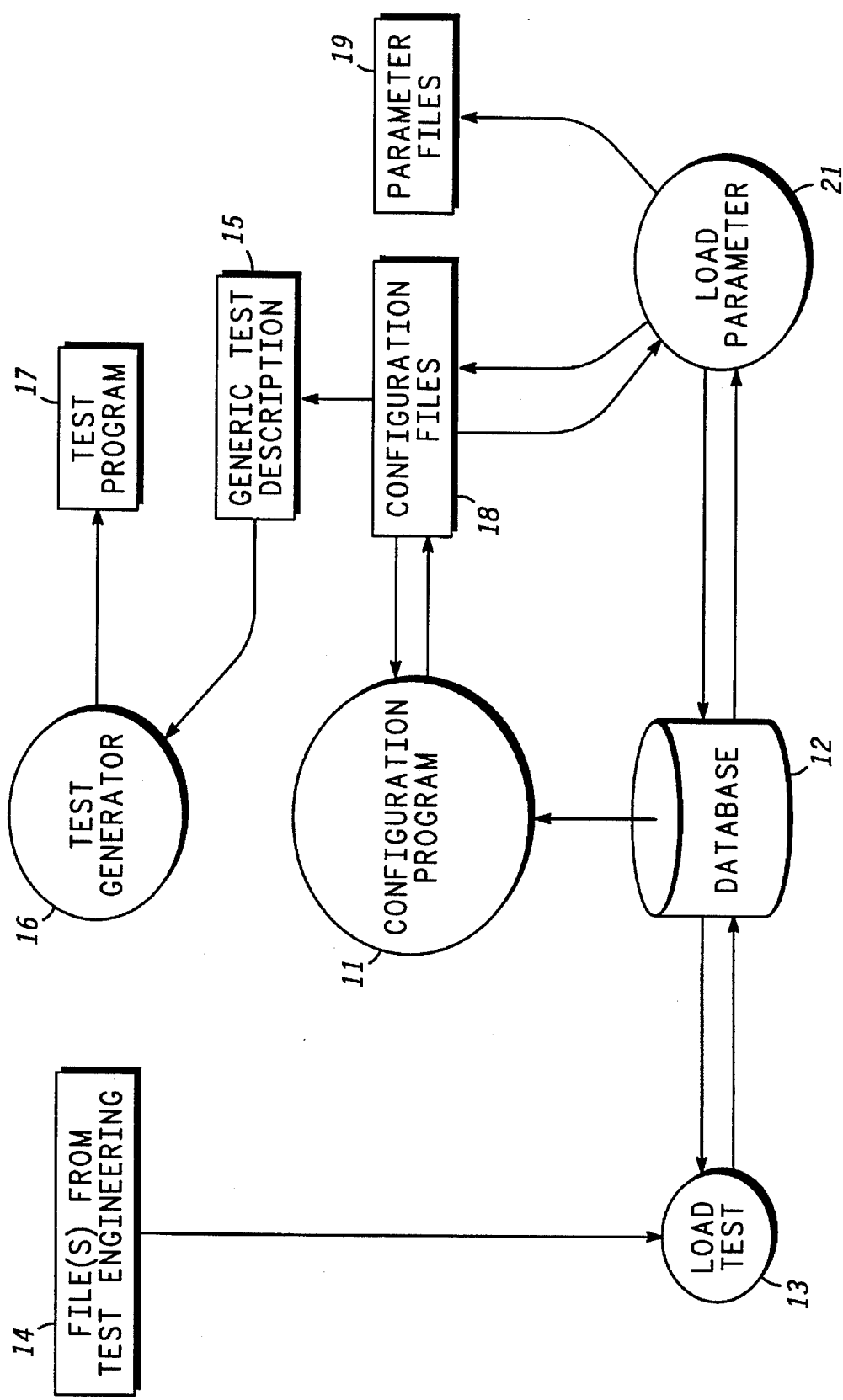
FIG. 1 shows a schematic diagram of a database system.

FIG. 1 is a schematic diagram which shows a database system. Files 14, which are generated by test engineering reflect the criteria for testing the product. Files 14 identify testing options available for a product or process structure for making the product. Each product has an associated measurement set, and each process structure for making the product has an associated measured entity. A load test program 13 translates these files into a form suited to a database 12. Load test program 13 inserts the various testing options for each product and structure type into database 12. Database 12 acts as a central repository for all information pertaining to products and structure types. The stored information includes: a set of criteria which differentiate individual product and processing entities within a structure class, formatting of parameter names, limit data, and testing options. A configuration program 11 interacts with configuration files 18 to retain a set of information depicting a formulated parameter name and associated test description for each measurement or measured entity. Information from the configuration files is extracted to form a generic test description 15. A test generator 16 uses generic test description 15 to generate a test program 17 which is appropriate for the process and product entity being tested. Typically, this program is specific to the particular tester used with the present invention. It should be noted that the particular tester used with the present invention is not a limitation of the present invention. A load parameter program 21 uses configuration files 18 to extract information from database 12 concerning the test description and selected testing options for a particular product and processing entity. Load parameter program 21 supplements this information with product and process data from database 12 to identify individual entity data. The load parameter program uses the combination of test, product and process information to generate descriptions for parameter files 19 which are used by engineers to refine and revise the product. As a result all relevant parameters are grouped in a single data collection operation into the set of parameter files 19. Reference numbers used in FIG. 1 will be used to refer back to throughout the remainder of this section.

Figure 2:
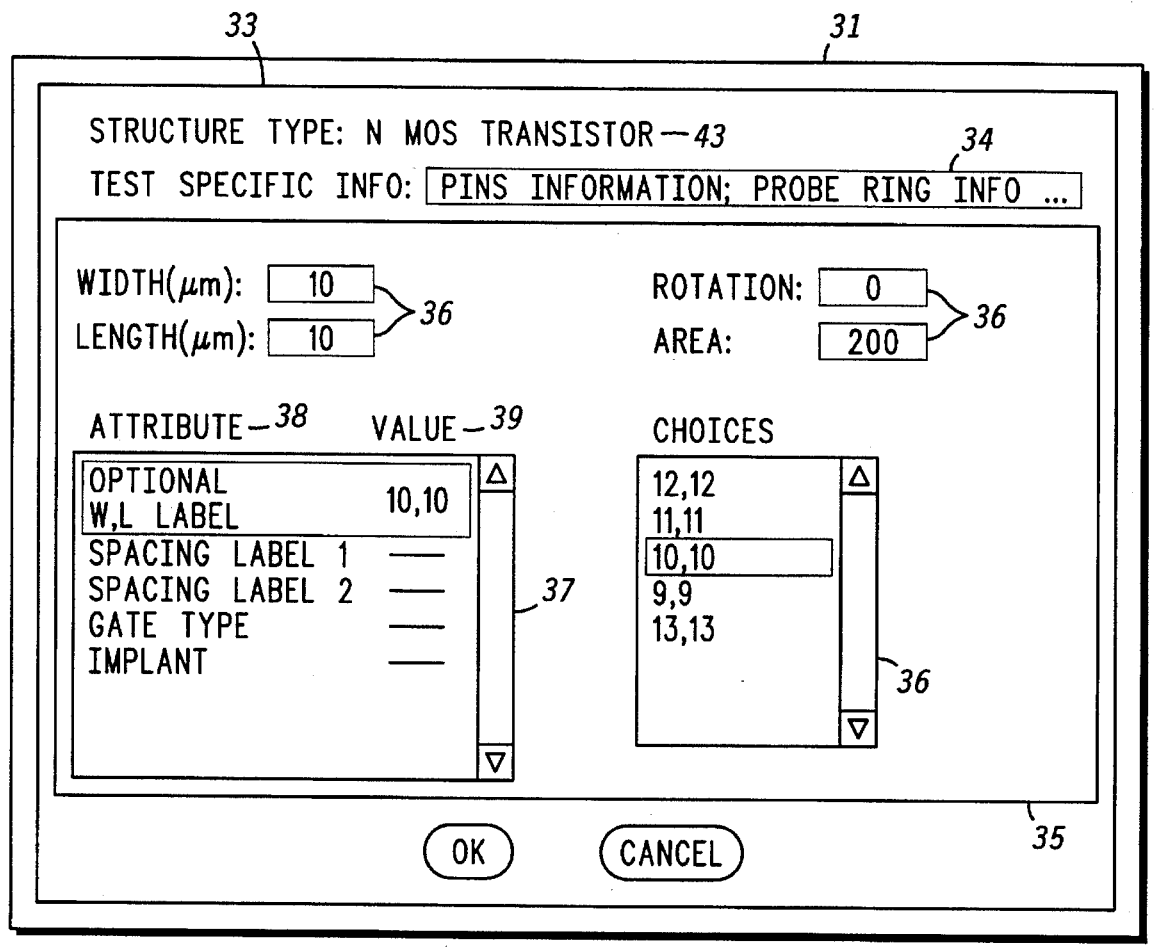
FIG. 2 shows a typical dialog screen used to collect information for the system of FIG. 1.

FIG. 2 shows a dialog screen used for information collection by the system of FIG. 1. A display screen 31 is used to display an interactive query 33 for collection of data to identify a specific entity of a structure type 43. In this example structure type 43 is an N-type MOS transistor. Structure type 43 defines the class of entities to be measured. For the example illustrated in FIG. 2, the set of transistors that are N-type MOS transistors serve as the class of entities, also referred to as the structure type. Furthermore, the individual transistors that are N-type MOS transistors serve as entities within the class of entities. For example, an N-type MOS transistor having a width of 10 microns and a length of 10 microns is an individual entity within the class of entities, and an N-type MOS transistor having a width of 11 microns and a length of 11 microns is another individual entity within the class of entities. The information required to delineate a particular entity is portrayed in a query area 35 within the screen. The contents and format of query area 35 are configured in accordance with the specification and requirements of the user. For example, in accordance with the class of entities being N-type MOS transistors, query area 35 includes the name of the class of entities, i.e., N-type MOS transistors, comments about the elements or entities within the class of entities, parameters 36 describing the entities within the class of entities, and attributes possessed by the entities. Since this information is formatted in accordance with the preferences of the end user, it is said to be dynamically configured. This delineation information for a particular entity of this structure type is recorded in database 12. Test specific information 34 records comments and readable text to supplement the test information obtained from file 14 which was derived from test engineering. It should be noted that parameters 36 include detailed information such as, for example, width, length, rotation, and total area of the transistor being tested. This detail information is queried based on delineation criteria retained in database 12. Certain parameters, which serve as criteria for distinguishing entities within the class of entities, have both an attribute 38 and a predetermined value 39. These are descriptive labels not internal codes and have a selected value for a particular structure description. A list of alternative values 37 allows value 39 to be selected from a list of legal values. Reference numbers used in FIG. 2 will be used to refer back to throughout the remainder of this section.

FIG. 3 illustrates an example of a dialog screen showing that display screen 40 is used to prompt and query the user concerning which entities and associated tests are to be defined as parameters and measured test results. More particularly, FIG. 3 illustrates that for structure type 43 being an N-type MOS transistor, potential tasks 41 include tests such as, for example, threshold voltage (VT) tests, transconductance (GM) tests, leakage current tests, etc. Moreover, for each task 41 or test there is an associated entity 42 or device type. Thus, display screen 40 serves as a matrix for selecting a particular entity 42 and the task or test 41 to be performed on entity 42. In other words, and by way of example, the columns of display screen 40 represent entities on which tests are to be performed and the rows indicate the particular test to be performed.

To perform a desired test or desired tests on a particular entity, the row and column associated with the particular test is selected. In other words, a cell associated with the particular row and column is selected. Thus, cells 44 having an "X" therein are selected cells, whereas the cells that are not selected are left blank. In accordance with the example of FIG. 3, a transistor having a width and a length of 10 microns is tested. The parameters to be measured for the transistor include threshold voltage and transconductance. The test conditions for testing the transistor include measuring the threshold voltage and the transconductance with 100 millivolts (100 mV) applied to the drain and 0 volts applied to the well. It should be understood that entity 42 has a selection cell 44 representing potential tests 41 which could be performed on that entity. The user uses a point-and-click interface to toggle each selection between a selected cell 44 and an unselected cell 47. Each selected cell 44 identifies a unique combination of an entity and associated tests and test conditions. Selected cells 44 will have parameter and test descriptions defined in configuration file 18 (FIG. 1). Test generator 16 and load parameter program 21 will generate test programs 17 and parameter files 19 based on the contents of configuration file 18. The relevant information is extracted into an intermediate generic test description 15 which is then used to generate the tester specific test programs 17. Each selected cell 44, unselected cell 47, and undefined cell 46 is a possible parameter representing a test performed on a particular device in a particular entity.

Additional entities for a structure type using undefined cells 46 are easily added by pointing at entity column heading 48 and clicking the mouse button. Upon clicking entity column heading 48, interactive query 33 is displayed. The details for delineating a new entity from existing entities for this structure type are then entered. By clicking on an entity column heading 48 which corresponds to an existing entity 42, interactive query 33 corresponding to that entity 42 is displayed, allowing editing of the previously defined entity information.

Operation of the database system requires defining a class of entities to be measured, in this example structure type 43. A set of criteria which distinguish the desired entities within the class of entities to be measured is defined. Typically this set includes parameters such as width and height of a transistor type. In accordance with the example shown in FIGS. 2 and 3, class of entities 43 include N-type MOS transistors and the desired entities within the class of entities are individual N-type MOS transistors distinguished by a set of criteria such as their lengths and widths. Thus, one desired N-type MOS transistor may be defined by the set of criteria which includes a width and length, wherein the widths and lengths are 10 microns. Another desired N-type MOS transistor may be defined by the set of criteria which includes a width and length, wherein the widths and lengths are 11 microns. A computer display is used to show the corresponding query area 35 in accordance with the set of criteria, and using the format defined by query area 35. The user interactively specifies values which are related to individual entities using query area 35. The set of measurements 41 which is related to the class of entities to be measured is displayed on the computer screen. The set of measurements is then associated with the set of criteria in database 12.

Parameter labels are generated from selected cells 44 which uniquely identify each association of a measurement with an entity in accordance with the set of criteria which are found in database 12. In other words, a name, i.e., a parameter label, is generated for a particular set of tests and test conditions performed on a particular entity. For example, assume it is desirable to measure the threshold voltage and transconductance of the N-type MOS transistor having a width and a length of 10 microns. In addition, assume that the threshold voltage and the transconductance are measured with 100 mV applied to the drain and 0 volts applied to the well. To uniquely identify the sets of tests and test conditions as well as the types of transistors to which these tests are applied, names or parameter labels are generated. Thus, the type of transistor, i.e., an N-type MOS transistor having a width and a length of 10 microns, serves as the entity and the test type, and test conditions serve as the set of predetermined criteria. For example, the parameter name becomes:

$$VT{:}N, 10{\times}10{:}D{=}0.1V{:}W{=}0V$$

for the N-type MOS transistor having a width and length of 10 microns and the threshold voltage measured with 100 mV applied to the drain and 0 volts applied to the well; and the parameter name becomes:

$$GM{:}N, 10{\times}10{:}D{=}0.1V{:}W{=}0V$$

for the N-type MOS transistor having a width and length of 10 microns and the transconductance measured with 100 mV applied to the drain and 0 volts applied to the well. In addition, the parameter labels are generated using a formatting rule which extracts information from entity 42 and test description 41. A set of associated engineering limits, such as specification limits and control limits, are defined for each labeled parameter and also saved in database 12. For example, the user may define target limits, upper and lower specification limits, upper and lower control limits, etc. A detailed list of parameter components which describe individual criteria for both the measurement and the measured entity is created based on the selected cells 44 associated with that entity. In other words, the elements describing the conditions of the VT or GM measurement, e.g., the voltages applied to the drain and well and the description of each entity, e.g., width and length of an N-type MOS transistor for each entity are formed into a list. Collectively, this list serves as a generic test description 15. In other words, generic test description 15 is generated based on the detailed list of parameter components, test specific information 34, test description 41, and the parameter labels. The detailed list of components is used to facilitate the selection of desired parameters for analysis of those parameters across all relevant classes. For example this step allows extraction of data related to all N-MOS transistors having a length of 10 microns regardless of other criteria.

By now it should be clear that the present invention provides a method for gathering, storing, and analyzing large amounts of engineering data in an organized fashion. This method is usable at many sites and has flexible configuration options. System configuration consists of loading information into standard database tables. As a result the configuration defines the relationships between the system components as well as the behavior of individual system components.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A method for describing measured results, comprising the steps of:

defining a class of entities to be measured;

defining a set of criteria which distinguish entities within the class of entities to be measured;

dynamically configuring a computer display format based on the set of criteria;

displaying the set of criteria on a computer display according to the computer display format;

interactively specifying values related to an individual entity;

displaying a predetermined set of measurements on the computer display, the predetermined set of measurements being the set related to a valid class of entities to be measured;

associating a predetermined set of measurements with the set of criteria; and generating a parameter label which uniquely identifies the predetermined set of measurements that is associated with the set of criteria, wherein the parameter label describes the measured result.

2. The method for describing measured results of claim 1 further comprising:

generating a plurality of parameter labels, which uniquely identifies each association of a measurement with an entity in accordance with a set of predetermined criteria.

3. The method for describing measured results of claim 2 further comprising:

defining a set of associated engineering limits for each of the labeled parameters.

4. The method for describing measured results of claim 1 further comprising:

generating a detailed list of parameter components which describe individual criteria for both the measurement and the measured entity.

5. The method for describing measured results of claim 4 further comprising:

grouping of a plurality of parameters into a description of a single data collection operation.

6. The method for describing measured results of claim 4 further comprising:

generating a generic test description based on the detailed list of components.

7. The method for describing measured results of claim 6 further comprising:

generating a tester specific test program based on the generic test description.

8. The method for describing measured results of claim 5 further comprising:

using the detailed list of parameter components to facilitate the selection of desired parameters for analysis of those parameters within a plurality of classes.

9. A method for describing measured results, comprising the steps of:

defining the measurement criteria for each class delineated by component;

defining an entity criteria which defines the entities within each class;

defining a limits criteria for limits associated with each of a plurality of components;

initializing a computer display based on the measurement criteria, the entity criteria and the limits criteria;

generating a detailed list of parameter components which describe individual criteria for both the measurement and the measured entity;

grouping of a plurality of parameters into a description of a single data collection operation; and generating a generic test description based on the detailed list of components, wherein the generic test description describes the measured results.

10. A method for describing measured results and using the measured results in a tester specific test program, comprising the steps of:

defining the measurement criteria for each class delineated by component;

defining an entity criteria which defines the entities within each class;

defining a limits criteria for limits associated with each of a plurality of components;

initializing a computer display based on the measurement criteria, the entity criteria and the limits criteria;

generating a detailed list of parameter components which describe individual criteria for both the measurement and the measured entity;

grouping a plurality of parameters into a description of a single data collection operation;

generating a generic test description based on the detailed list of components, wherein the generic test description describes the measured results; and generating a tester specific test program based on the generic test description.

* * * * *